United States Patent
Olgado et al.

(10) Patent No.: US 6,720,263 B2
(45) Date of Patent: Apr. 13, 2004

(54) PLANARIZATION OF METAL LAYERS ON A SEMICONDUCTOR WAFER THROUGH NON-CONTACT DE-PLATING AND CONTROL WITH ENDPOINT DETECTION

(75) Inventors: Donald J. K. Olgado, Palo Alto, CA (US); Joseph J. Stevens, San Jose, CA (US); Alexander Lerner, San Jose, CA (US)

(73) Assignee: Applied Materials Inc., Santa Clara, CA (US)

( * ) Notice: Subject to any disclaimer, the term of this patent is extended or adjusted under 35 U.S.C. 154(b) by 0 days.

(21) Appl. No.: 09/981,505

(22) Filed: Oct. 16, 2001

(65) Prior Publication Data

US 2003/0073310 A1 Apr. 17, 2003

(51) Int. Cl.[7] .............................................. H01L 21/302
(52) U.S. Cl. ........................................ 438/690; 438/748
(53) Field of Search ................................ 438/690–693, 438/745–751

(56) References Cited

U.S. PATENT DOCUMENTS

| | | | |
|---|---|---|---|
| 4,033,833 A | 7/1977 | Bestel et al. ................ 204/15 |
| 5,036,015 A | 7/1991 | Sandhu et al. ............... 437/8 |
| 5,275,711 A | 1/1994 | Abys et al. .................. 204/434 |
| 5,284,554 A | 2/1994 | Datta et al. .................. 204/129.5 |
| 5,308,438 A | 5/1994 | Cote et al. ................... 156/636 |
| 5,486,282 A | 1/1996 | Datta et al. .................. 205/123 |
| 5,543,032 A | 8/1996 | Datta et al. .................. 205/670 |
| 5,595,526 A | 1/1997 | Yau et al. .................... 451/8 |
| 5,667,629 A | 9/1997 | Pan et al. .................... 438/13 |
| 5,743,784 A | 4/1998 | Birang et al. ................ 451/21 |
| 5,846,882 A | 12/1998 | Birang ....................... 438/692 |
| 5,865,984 A | 2/1999 | Corbin, Jr. et al. ......... 205/670 |
| 5,976,347 A | 11/1999 | Wakabayashi et al. ..... 205/640 |
| 6,046,111 A | 4/2000 | Robinson ................... 438/693 |
| 6,074,544 A | 6/2000 | Reid et al. .................. 205/157 |
| 6,103,096 A | 8/2000 | Datta et al. ................. 205/686 |
| 6,110,346 A | 8/2000 | Reid et al. .................. 205/157 |
| 6,117,777 A | 9/2000 | Zhou et al. ................. 438/692 |
| 6,139,703 A | 10/2000 | Hanson et al. ............. 204/212 |
| 6,159,354 A | 12/2000 | Contolini et al. ........... 205/96 |
| 6,447,668 B1 * | 9/2002 | Wang ......................... 205/645 |

* cited by examiner

*Primary Examiner*—H. Jey Tsai
(74) *Attorney, Agent, or Firm*—Moser, Patterson & Sheridan

(57) ABSTRACT

A non-contact apparatus and method for removing a metal layer from a substrate are provided. The apparatus includes a rotatable anode substrate support member configured to support a substrate in a face-up position and to electrically contact the substrate positioned thereon. A pivotally mounted cathode fluid dispensing nozzle assembly positioned above the anode substrate support member is also provided. A power supply in electrical communication with the anode substrate support member and the cathode fluid dispensing nozzle is provided, and a system controller configured to regulate at least one of a rate of rotation of the anode substrate support member, a radial position of the cathode fluid dispensing nozzle, and an output power of the power supply is provided. The method provides for the removal of a metal layer from a substrate by rotating the substrate in a face up position on a rotatable substrate support member. A cathode fluid dispensing nozzle is positioned over a central portion of the substrate and a metal removing solution is dispensed from the cathode fluid dispensing nozzle onto the central portion of the substrate. An electrical bias is applied between the substrate and the cathode fluid dispensing nozzle, which operates to deplate the metal layer below the fluid dispensing nozzle.

17 Claims, 7 Drawing Sheets

PLANARIZATION OF METAL LAYERS ON A SEMICONDUCTOR WAFER THROUGH NON-CONTACT DE-PLATING AND CONTROL WITH ENDPOINT DETECTION

BACKGROUND OF THE INVENTION

1. Field of the Invention

Embodiments of the present invention generally relate to non-contact apparatus and methods for deplating a metal layer from a substrate using an endpoint detection system.

2. Description of the Related Art

Reliably producing sub-quarter micron and smaller features is one of the key technologies for the next generation of very large scale integration (VLSI) and ultra large-scale integration (ULSI) of semiconductor devices. However, as the fringes of circuit technology are advanced, the shrinking dimensions of interconnects in VLSI and ULSI technologies places additional demands on processing capabilities. More particularly, the multilevel interconnects that lie at the heart of VLSI and ULSI require precise processing of high aspect ratio features, such as vias, contacts, lines, and other interconnects. Reliable formation of these interconnects is important to VLSI and ULSI success and to the continued effort to increase circuit density and quality of individual substrates and die.

In order to further improve the current density of semiconductor devices on integrated circuits, it has become necessary to use conductive materials having low resistivity and materials having low dielectric constants (low k, defined herein as having dielectric constants, k, less than about 4.0) as insulating layers to reduce the capacitive coupling between adjacent interconnects. Increased capacitive coupling between layers can detrimentally affect the functioning of semiconductor devices.

Although aluminum has been the metal of choice in conventional devices, copper and its alloys have become the materials of choice for sub-quarter-micron interconnect technology, as copper has a lower resistivity than aluminum, (1.7 $\mu\Omega$-cm compared to 3.1 $\mu\Omega$-cm for aluminum), a higher carrying capacity, and a greater resistance to electromigration. These characteristics are important for supporting the higher current densities experienced at high levels of integration and increased device speed. Additionally, copper exhibits favorable thermal conductivity and is generally available in a relatively pure state.

One difficulty in using copper in semiconductor devices is that copper is difficult to accurately etch and achieve a precise pattern. Etching copper using traditional deposition/etch processes for forming interconnects has been less than satisfactory, as reliable and consistent endpoint detection is generally not available with conventional apparatuses and processes. Therefore, the current trend in the industry is to develop alternative methods and apparatuses for reliably and accurately forming and removing copper layers from substrates, while leaving the copper filled features intact in the substrate.

One method for forming vertical and horizontal interconnects is by a damascene or dual damascene method. In the damascene method, one or more dielectric materials, such as the low k dielectric materials, are deposited and pattern etched to form the vertical and horizontal interconnects. Conductive materials, such as copper-containing materials and other materials, such as barrier layer materials used to prevent diffusion of copper-containing materials into the surrounding low k dielectric, are then inlaid into the etched pattern. These conductive materials are deposited in excess in order to insure that the features formed in the dielectric layer are adequately filled. However, the excess copper-containing materials and excess barrier layer material external to the etched pattern, such as on the field of the substrate, must be removed.

As the various layers of materials are sequentially deposited and removed in a fabrication process, the uppermost surface of the substrate may become non-planar across its surface and require planarization. Planarizing a surface, or "polishing" a surface, is a process where material is removed from the surface of the substrate to form a generally even, planar surface. Planarization is useful in dual damascene processes to remove excess deposited material and to provide an even surface for subsequent levels of metallization and processing. Planarization may also be used in removing undesired surface topography and surface defects, such as rough surfaces, agglomerated materials, crystal lattice damage, scratches, and contaminated layers or materials.

Chemical mechanical planarization, or chemical mechanical polishing (CMP), is a common technique used to planarize substrates. In conventional CMP techniques, a substrate carrier or polishing head is mounted on a carrier assembly and positioned in contact with a polishing media in a CMP apparatus. The carrier assembly provides a controllable pressure to the substrate urging the substrate against the polishing media. The media is moved relative to the substrate by an external driving force. Thus, the CMP apparatus effects polishing or rubbing movement between the surface of the substrate and the polishing media while dispersing a polishing composition to effect both mechanical activity and chemical activity.

Conventionally, in polishing copper features, such as dual damascene features, the copper-containing material is polished to the level of the barrier layer, and then the barrier layer is polished to a level of the underlying dielectric layer using abrasive polishing solutions. However, such polishing processes often result in uneven removal of materials, such as copper in features and the underlying dielectric layer between features, resulting is the formation of topographical defects, such as concavities or depressions in the features, referred to as dishing, and excess removal of dielectric material surrounding features, referred to as erosion.

FIG. 1 is a schematic view of a substrate illustrating dishing and incomplete copper removal. The exemplary substrate 100 includes conductive lines 111 and 12 are formed by depositing conductive materials, such as copper or copper alloy, in a feature definition formed in the dielectric layer 110, typically comprised of silicon oxides or other dielectric materials. After planarization, a portion of the conductive material in conductive line 112 is depressed by an amount 113, referred to as the amount of dishing, forming a concave copper surface. Additionally, dielectric material, such as around feature 111, may be eroded from the polishing process and expose the sides of the features to subsequent processing steps. Dishing and erosion result in a non-planar surface that impairs the ability to print high-resolution lines during subsequent photolithographic steps and detrimentally affects subsequent surface topography of the substrate and device formation. Dishing and erosion also detrimentally affect the performance of devices by lowering the conductance and increasing the resistance of the devices, contrary to the benefit of using higher conductive materials, such as copper. Further still, the topography of the surface and/or the nature of the polishing techniques may also generate areas where the copper layer is not completely removed from the dielectric surface, as generally noted by 114. These remaining copper islands 114, which generally result from poor endpoint detection, are undesirable, as they facilitate electrical shorting between features of the substrate.

An additional difficulty also arises when using low k dielectric material in copper dual damascene formation. Low k dielectric materials are typically soft and porous, and therefore, conventional polishing pressures, which are generally about 4 psi or greater, can damage the low k dielectric materials and form defects in the substrate surface. Therefore, in order to avoid damaging low k materials during polishing/planarizing, the pressure must be reduced. However, polishing substrates at reduced pressures often results in less than desirable polishing rates, non-uniform polishing, and less than desirable planarization of the substrate surface. Such process difficulties result in reduced substrate throughput and less than desirable polish quality of the substrate surface, which may detrimentally affect subsequent processing. Additionally, low polishing pressure processes may be unable to sufficiently remove all of the desired copper materials from a substrate surface such as at the interface between copper and the barrier layer, which is generally nonplanar. Such copper materials retained on the substrate surface, or residues, can detrimentally affect device formation, such as creating short-circuits within or between devices, reduce device yields, reduce substrate throughput, and detrimentally affect the polish quality of the substrate surface.

Therefore, there exists a need for a non-contact apparatus and method for removing a metal layer from a substrate. Further, there is a need for an apparatus and method for determining a metal layer removal endpoint.

SUMMARY OF THE INVENTION

Embodiments of the invention generally provide a non-contact apparatus and method for removing a metal layer from a substrate. The apparatus includes a rotatable anode substrate support member configured to support a substrate in a face-up position and to electrically contact the substrate positioned thereon. A cathode fluid dispensing nozzle assembly is pivotally mounted above the anode substrate support member. A power supply is in electrical communication with the anode substrate support member and the cathode fluid dispensing nozzle. A system controller is configured to regulate at least one of a rate of rotation of the anode substrate support member, a radial position of the cathode fluid dispensing nozzle, and an output power of the power supply.

Embodiments of the invention further provide an apparatus for electrochemically removing a metal layer from a substrate surface, wherein the apparatus includes a processing chamber having a rotatable anode substrate support member positioned therein and a radially mounted cathode fluid dispensing assembly positioned in the processing chamber, the cathode fluid dispensing assembly being in communication with a pivotal actuator configured to selectively adjust a radial position of the cathode fluid dispensing assembly. A power supply having an anode terminal in electrical communication with the anode substrate support member and a cathode terminal in communication with the cathode fluid dispensing assembly is provided, and a microprocessor controller in communication with the pivotal actuator, the microprocessor controller being configured to control the radial position of the cathode fluid dispensing assembly relative to a center of the substrate via selective actuation of the pivotal actuator is also provided.

Embodiments of the invention further provide a method for removing a metal layer from a substrate, wherein the method includes rotating a substrate in a face up position on a rotatable substrate support member, positioning a cathode fluid dispensing nozzle mounted on a distal end of a pivotally mounted fluid dispensing arm over a central portion of the substrate, and dispensing a metal removing solution from the cathode fluid dispensing nozzle onto the central portion of the substrate. The method further includes applying an electrical bias between the substrate and the cathode fluid dispensing nozzle, and adjusting a radial position of the cathode fluid dispensing nozzle outward from the central portion of the substrate when a parameter of the electrical bias exceeds a predetermined threshold.

Embodiments of the invention further provide a method for controlling an electrochemical deplating process. The method includes monitoring at least one of a plating circuit voltage and a plating circuit resistance, and adjusting a radial position of a nozzle dispensing an electrolytic solution onto a substrate in order to deplate a metal layer therefrom when at least one of the plating circuit voltage and the plating circuit resistance exceeds a predetermined threshold.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 1:
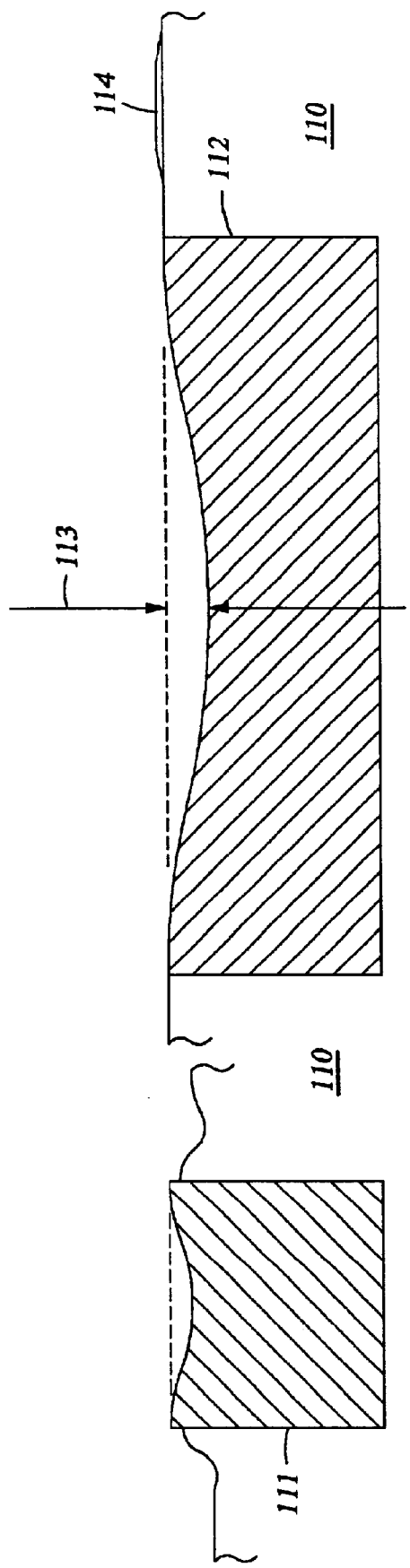
FIG. 1 illustrates a low k material based substrate planarized with a conventional CMP process.
Figure 2:
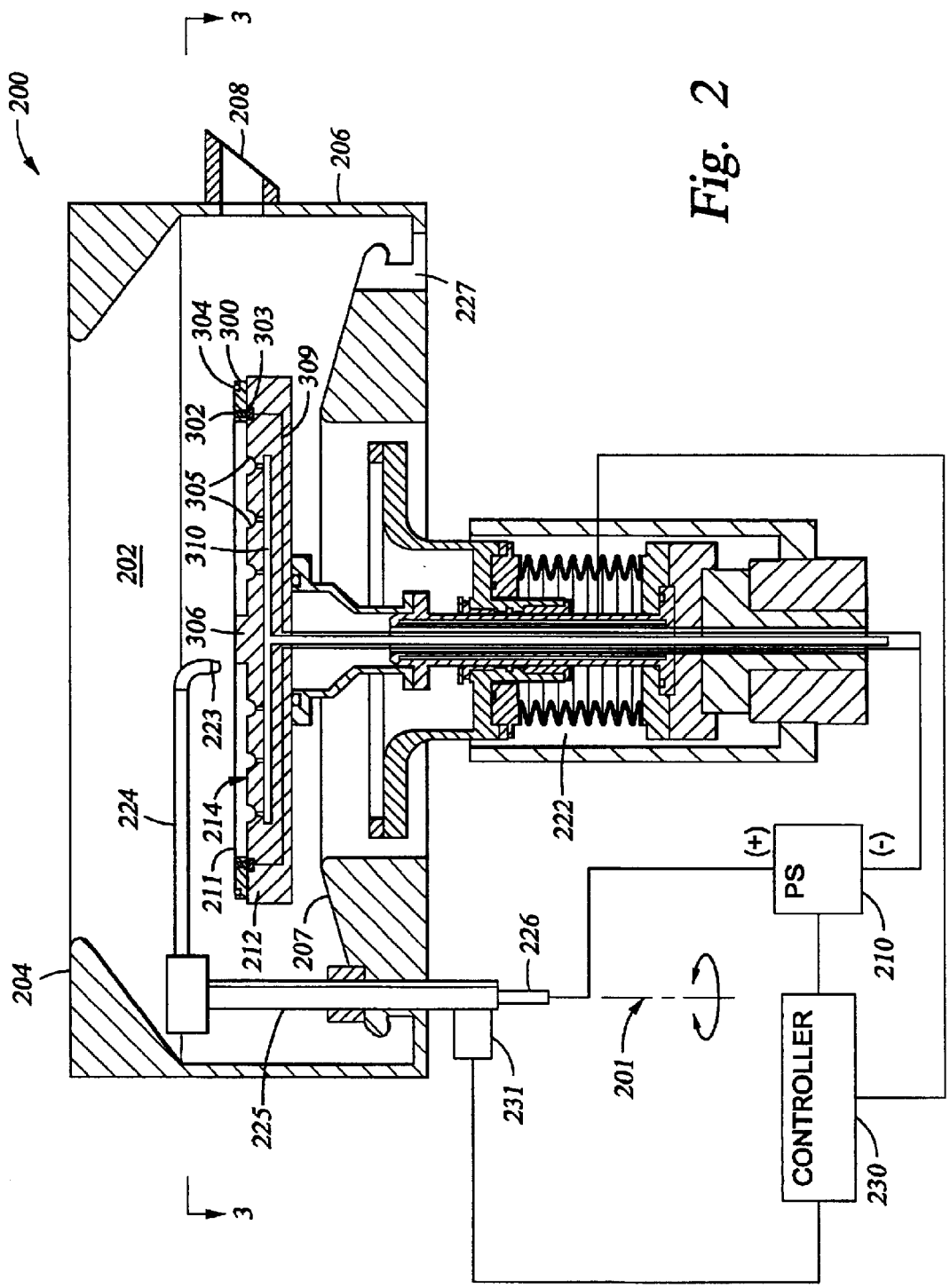
FIG. 2 illustrates an exemplary deplating chamber of the invention.
Figure 3:
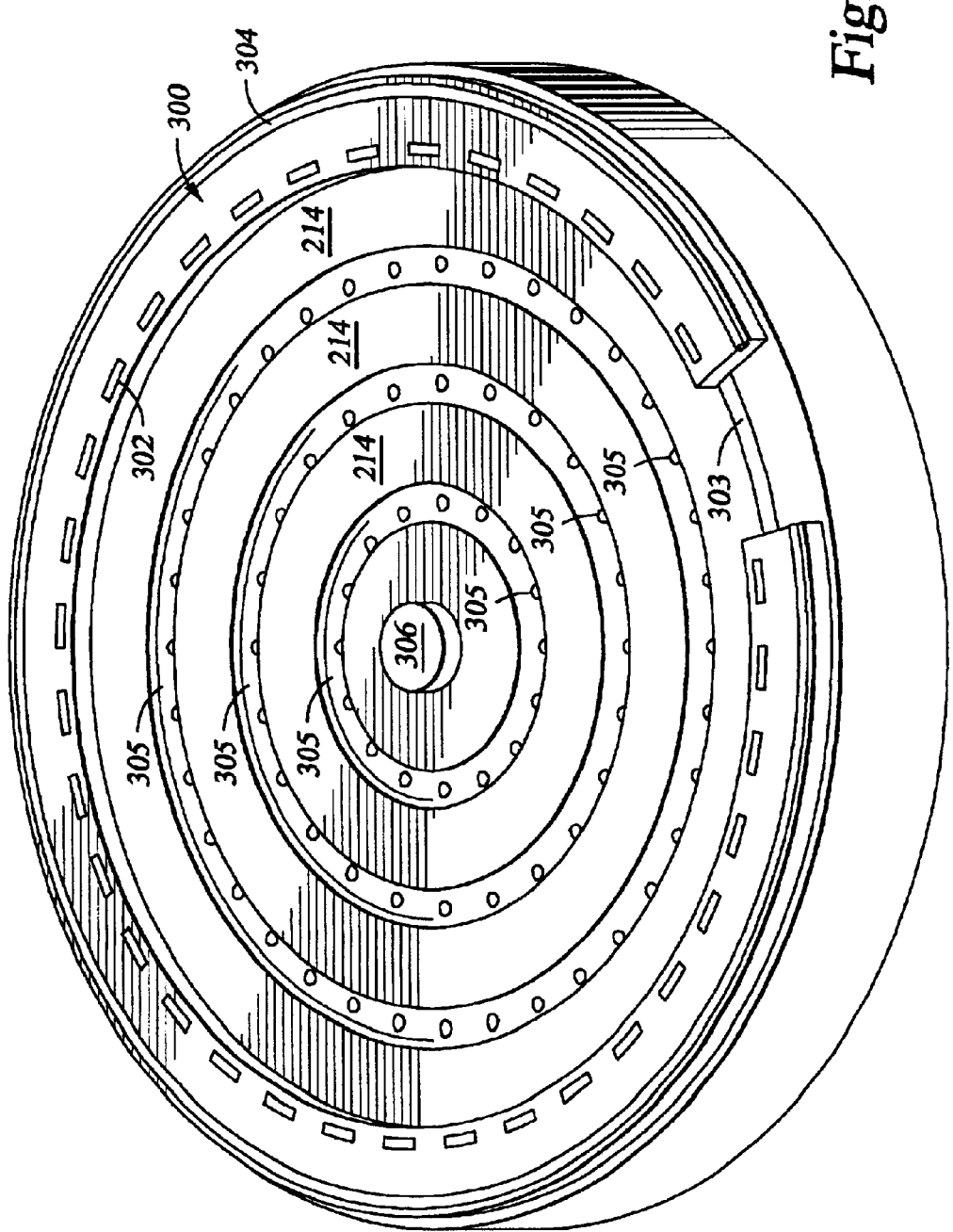
FIG. 3 illustrates a perspective view of an exemplary substrate support member and a partial sectional view of contact ring of the invention.
Figure 4:
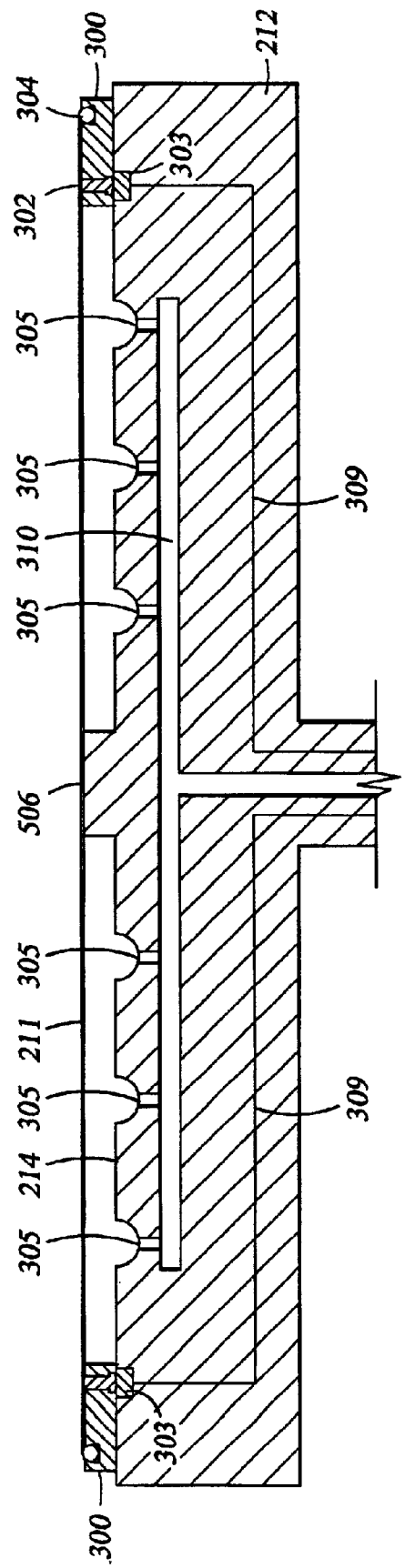
FIG. 4 illustrates a sectional view of an exemplary substrate support member of the invention.

FIG. 2 generally illustrates a sectional view of an exemplary electro chemical deplating process cell 200 of the invention. Deplating cell 200 includes a processing compartment 202 having a top 204, sidewalls 206, and a bottom 207. A substrate support member 212, which is shown in perspective in FIG. 3 and in section in FIG. 4, is disposed in a generally central location within chamber 200. Substrate support 212 includes a substrate receiving surface 214 on the upper side thereof that is configured to receive a substrate in a "face-up" position, i.e. in a position where the production surface of the wafer is facing away from the substrate support member 212. Substrate support member 212 may be, for example, manufactured from an insulative material, such as ceramic materials, alumina ($Al_2O_3$), a Teflon® coated metal (such as aluminum or stainless steal), silicon carbide (SiC), or other materials suitable for deplating processes. An insulative anode electrical contact ring 300 is mounted to the receiving surface 214 of substrate support 212 proximate the perimeter of substrate support 212, and includes a plurality of conductive electrical contacts 302 extending therefrom and an annular seal member 304 in communication therewith. Receiving surface 214 may include one or more vacuum channels, ports, or apertures 305 that are in communication with a vacuum source (not shown) via a conduit 310 formed into substrate support member 212. Therefore, channels 305, when supplied with a negative pressure from the vacuum source, are configured to secure or chuck a substrate to substrate support member 212 for processing. The substrate is generally chucked to the substrate support member 212 with the backside or non-production surface of the substrate facing the substrate support member 212. Therefore, the production surface of the substrate will be exposed or facing away from receiving surface 214. This configuration allows ring 300 to electrically contact the non-production or backside of the substrate via electrical contacts 302. Alternatively, contact ring 300 and contacts 302 may be configured to electrically engage the production surface of the substrate proximate the perimeter thereof in the exclusion zone, for example. A motor 222 may be coupled to the substrate support 212 in order to selectively rotate the substrate support 212 to spin a substrate positioned thereon.

Anode contact ring 300 is generally fixedly attached to the receiving surface 214 of substrate support 212 proximate the outer perimeter of support 212. Alternatively, anode contact ring 300 may be integrally formed into the receiving surface 214 of substrate support 212, thus creating a unitary substrate support member and anode contact ring. Seal member 304 may be an O-ring type seal, and the plurality of electrical contacts 302 may be positioned radially inward from seal 304. Seal 304 operates to provide a seal/barrier that prevents fluid solutions, i.e., an electrolytic deplating solution, from flowing/traveling to the back side/contact side of substrate 211, and therefore, provides a dry contact configuration. However, the present invention is not limited to configurations using an outer seal configuration, as it is contemplated that the seal may be positioned radially inward from contacts 302 in a wet contact-type configuration. Seal 304 may be manufactured from various materials known in the art to provide sealing capability and to maintain physical integrity in the presence of a deplating solutions. Examples of materials that may be used for seal 304 include plastic compounds, Teflon® compounds, Nylon® compounds, rubber compounds, and other materials used to manufacture seals known to be acceptable sealing materials for deplating apparatuses. Further, the outer surfaces of contact ring 300 that are exposed to the deplating solution are preferably coated or treated to provide a hydrophilic surface in order to encourage solution flow and contact therewith. Contact ring 300 may be manufactured from an insulative material, such as an insulative plastic, polyvinylidenefluoride (PVDF), perfluoroalkoxy resin (PFA), Teflon®, Tefzel™, Alumina ($Al_2O_3$), ceramics, and/or other suitable insulative materials.

The plurality of wafer contacts 302, which are manufactured from an electrically conductive material, are generally in communication with one or more electrical supply contacts 303 positioned on receiving surface 214 adjacent the plurality of electrical contacts 302, as shown in FIG. 4. Electrical supply contacts 303 may be used to communicate electrical energy from a power supply 210, which is in electrical communication with the electrical supply contacts 303 via conductors 309, to the plurality of electrical contacts 302. Power supply 210 may be a DC power supply configured to generate a constant DC output, or alternatively, power supply 210 may be configured to generate various DC waveforms, such as square waveforms, sinusoidal waveforms, saw-tooth waveforms, and/or other waveforms that may be generated by a power supply. The electrical supply contacts 303 may be a unitary conductive annular ring formed into the receiving surface 214 of substrate support 212, wherein the ring is configured to electrically engage each of the plurality of electrical contacts 302 in the anode contact ring 300 when ring 300 is mounted to substrate support 212. Alternatively, electrical supply contacts 303 may comprise a plurality of individual electrical supply contacts 303 formed into the receiving surface 214 of substrate support 212. In this configuration, each of contacts 303 may be radially positioned to cooperatively contact and electrically engage an individual one of the plurality of electrical contacts 302 in the anode contact ring 300. Therefore, each of contacts 303 may be configured to supply a specific individual electrical bias to each of contacts 302, through, for example, the use of a controller 230 configured to individually regulate the electrical bias applied to each of contacts 302 in order to control the uniformity of the electrical bias applied to the substrate 211. The regulation of the electrical bias applied to each of the contacts 302 may be, for example, implemented through a selectively controllable variable resistor positioned in series with each of contacts 302. Other alternative methods, apparatuses, and circuits may be used to control the electrical current and/or voltage applied to the contacts 302. Regardless of the configuration, supply contact(s) 303 operate to communicate electrical energy to the plurality of electrical contacts 302 in anode contact ring 300. Contacts 302, which are configured to electrically engage a backside conductive surface of substrate 211, may be manufactured from an electrically conductive material, such as copper (Cu), platinum (Pt), tantalum (Ta), titanium (Ti), gold (Au), silver (Ag), stainless steel, or other conductive materials compatible with semiconductor manufacturing processes. Low resistivity and low contact resistance, which are desired characteristics for contacts 302, may further be achieved by coating contacts 302 with an additional conductive material. Therefore, contacts 302 may, for example, be made of copper (resistivity for copper is approximately $2 \times 10^{-8}$ $\Omega \cdot m$) and be coated with platinum (resistivity for platinum is approximately $10.6 \times 10^{-8}$ $\Omega \cdot m$). Coatings such as tantalum nitride (TaN), titanium nitride (TiN), rhodium (Rh), Au, Cu, or Ag may be used on conductive base materials, such as stainless steel, molybdenum (Mo), Cu, and Ti. Contacts 302 may further be configured flex or bend upon contacting a substrate. This allows each of contacts 302 to cooperatively engage the substrate, as contacts that first engage the substrate upon placement of the substrate on ring 300 simply bend or flex to allow the remaining contacts 302 to simultaneously engage the substrate.

A cathode fluid dispensing unit, such as a rotatably mounted nozzle 223, may be disposed in chamber 200. Nozzle 223 may be configured to deliver a fluid, such as an electrolytic deplating solution, an etchant, deionized water, and/or an acid solution, to the surface of substrate 211 positioned on support 212. Nozzle 223 is attached to and is in fluid communication with a longitudinally extending arm 224, which has a substantially hollow interior portion that may be used to communicate fluids therethrough to nozzle 223. Arm 224 may be pivotally attached to support member 225, which also includes a fluid conduit 226 therein that may be used to communicate fluids therethrough to arm 224. Support member 225 may be rigidly attached to chamber bottom 207, or alternatively, support member 225 may be rotatably attached to chamber bottom 207 if arm 224 is rigidly attached to support member 225. As a result of the pivotal motion available from either arm 224 or support member 225, nozzle 223 may be positioned over the center of substrate 211 in order to deliver a fluid to the center of the substrate 211, and then nozzle 223 may be rotated about axis 201 in order to selectively dispense fluid across the surface of substrate 211 when substrate 211 is rotated. For example, as nozzle 223 is pivoted outward from the center of substrate 211, the fluid dispensed therefrom flows outward over an annular band of substrate 211 having a circular inner boundary that corresponds to the radial position of nozzle 223 from the center of substrate 211.

Nozzle 223 is generally in communication with a cathode source, such as the negative output of power supply 210, for example, which allows for an electrical potential to be applied between substrate 211 and nozzle 223, as a result of the positive terminal of power supply 210 being in electrical communication with substrate 211. As such, the deplating solution dispensed from nozzle 223 will generally be a conductive fluid, which allows the electrical potential applied to nozzle 223 to be communicated to substrate 211 via the conductive deplating solution. The electrical potential or bias applied between the substrate surface, which is configured as an anode in the present exemplary embodiment, and the cathode nozzle 223, operates to both accelerate the deplating process and to provide a monitorable endpoint control function, which will be further discussed herein. The size and shape of nozzle 223 may be adjusted in order to vary the rate of metal deplating. Chamber 200 further includes a drain 227 configured to collect fluids used in the chamber, and more particularly, fluids dispensed from nozzle 223 that run off the edge of substrate 211 and fall to the chamber bottom 207. In an alternative embodiment, nozzle 223 may be attached to a side wall 206 of chamber 200 through an arm 224 that extends to side wall 206. In this embodiment arm 206 may be pivotally mounted to side wall 206 in order to allow nozzle 223 to be positioned over various radial positions of the substrate. Alternatively, arm 224 may be configured to be selectively longitudinally extended, thus allowing nozzle 223 to be positioned over various radial positions over the substrate 211.

An actuator 231, positioned proximate support member 225, may be used to selectively pivot or rotate support member 225 and/or arm 224 about axis 201. Therefore, actuator 231 may be used to vary or adjust the radial position of nozzle 223 relative to axis 201, which also operates to vary the position of nozzle 223 relative to the center of substrate 211 being processed. Actuator 231, for example, may be a stepping motor configured precisely pivot arm 224 about axis 201 in order to vary the position of nozzle 223 relative to the center of substrate 211. The actuation of stepping motor 231 may be managed by an electronic controller 230 in communication therewith. Controller 231 may be a microprocessor based control system configured to receive control input from a user and various devices/sensors in system 200, execute a control program, and output control signals to various components of system 200. Therefore, in addition to controller 230 being in communication with actuator 231, controller 230 may also be in communication with motor 222 and power supply 210 in order to provide controlling signals thereto. As such, controller 230 may operate to regulate the rotation rate of substrate support 212 and the output of power supply 210. Actuator 231 may alternatively be used to longitudinally extend arm 224 to position nozzle 223 over selected radial positions of the substrate 211.

Figure 5A:
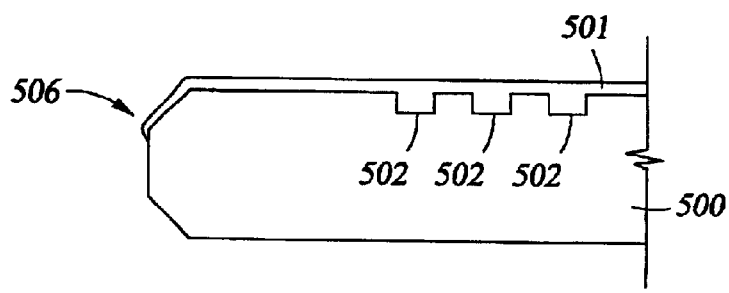
FIGS. 5a–5e illustrate an exemplary deplating sequence of the invention.

In operation, an apparatus of the invention may be used to remove a metal layer from a substrate. For example, during semiconductor processing, a copper layer may be deposited on a substrate to fill features 502 formed in the substrate 500, as illustrated in FIG. 5a. The copper fill layer 501 will generally be over deposited in order to completely fill the features 502, and therefore, the over deposited copper, which generally forms a continuous layer over the substrate surface, must be removed to reveal the individual copper filled features 502. In this situation, the substrate 500 having the over deposited copper layer 501 thereon may be placed in chamber 200 of the invention for removal of the over deposited copper layer 501. Substrate 500 may be transferred into chamber 200 via a transfer robot (not shown) configured to place substrate 500 on substrate receiving surface 214 of substrate support 212. The transfer robot may access chamber 200 via an opening 208 in a sidewall 206 of chamber 200, where opening 208 is in communication with the processing compartment 202. Once substrate 500 is placed on substrate receiving surface 214, the substrate 500 may be secured or chucked to substrate support member 212. Although various mechanical chucking and securing methods are contemplated within the scope of the invention, preferably, substrate 500 is vacuum chucked to substrate support member 212 using backside substrate contacts, which allows for uninterrupted fluid flow across the surface of substrate 500.

Figure 5B:
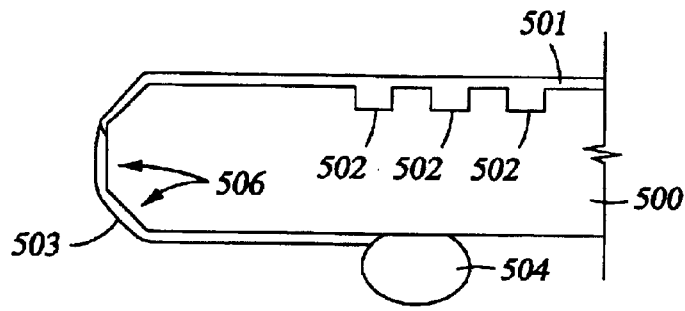

However, in a deplating process using a back side contact configuration of the invention, a substrate 500 having a metal layer 501 to be removed from above metal filled features 502 must first have a backside conductive layer 503 deposited thereon. If a conventional front side contact configuration is implemented, through, for example, the use of a front side contact ring positioned above substrate support 212 and being configured to be lowered onto the front side of substrate 211 and make electrical contact therewith, then the deposition of the backside conductive layer is unnecessary. In backside contact configurations, the backside conductive layer generally operates to conduct an electrical bias applied to substrate 500 by backside electrical contacts 302 to the metal layer 501 to be removed from the production surface or front side of substrate 500. Therefore, a backside conductive layer 503 will generally be deposited around the edge or bevel 506 to the backside of substrate 500, as illustrated in FIG. 5b. The deposition of backside conductive layer 503 may be accomplished though known deposition techniques, such as CVD, an electroless deposition process, or other deposition techniques. The deposition of backside conductive layer 503 will generally be conducted in a separate chamber, however, the present invention contemplates that the deposition of backside conductive layer 503 may be accomplished within chamber 200, assuming that the appropriate mechanical features for the particular deposition process were incorporated into chamber 200. A deposition seal or barrier 504 may be used in the deposition process of backside conductive layer 503 in order to limit the deposition width of conductive backside layer 503 to a predetermined area or band proximate the periphery of substrate 500. The predetermined backside deposition area or band may be calculated to be sufficient to establish backside contact, while not requiring substantial additional effort to remove the backside conductive layer 503.

Therefore, the width of deposition may be, for example, between about 3 millimeters and about 6 millimeters, as this width range generally allows sufficient area for electrical contact and seal configurations. Additionally, the other physical characteristics of backside layer 503, such as layer thickness, layer uniformity, and layer resistivity, for example, may be selected to provide optimal electrical conductivity to the metal layer 501 through a minimal resistance path, so that the current provided to metal layer 501 during the deplating process may be essentially equal around the circumference of wafer 500.

Figure 5C:
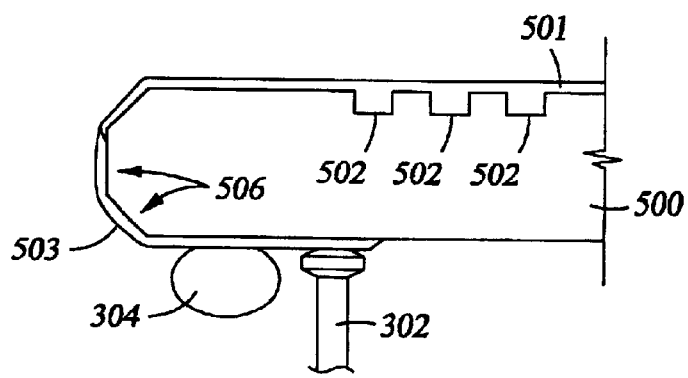
Figure 6:
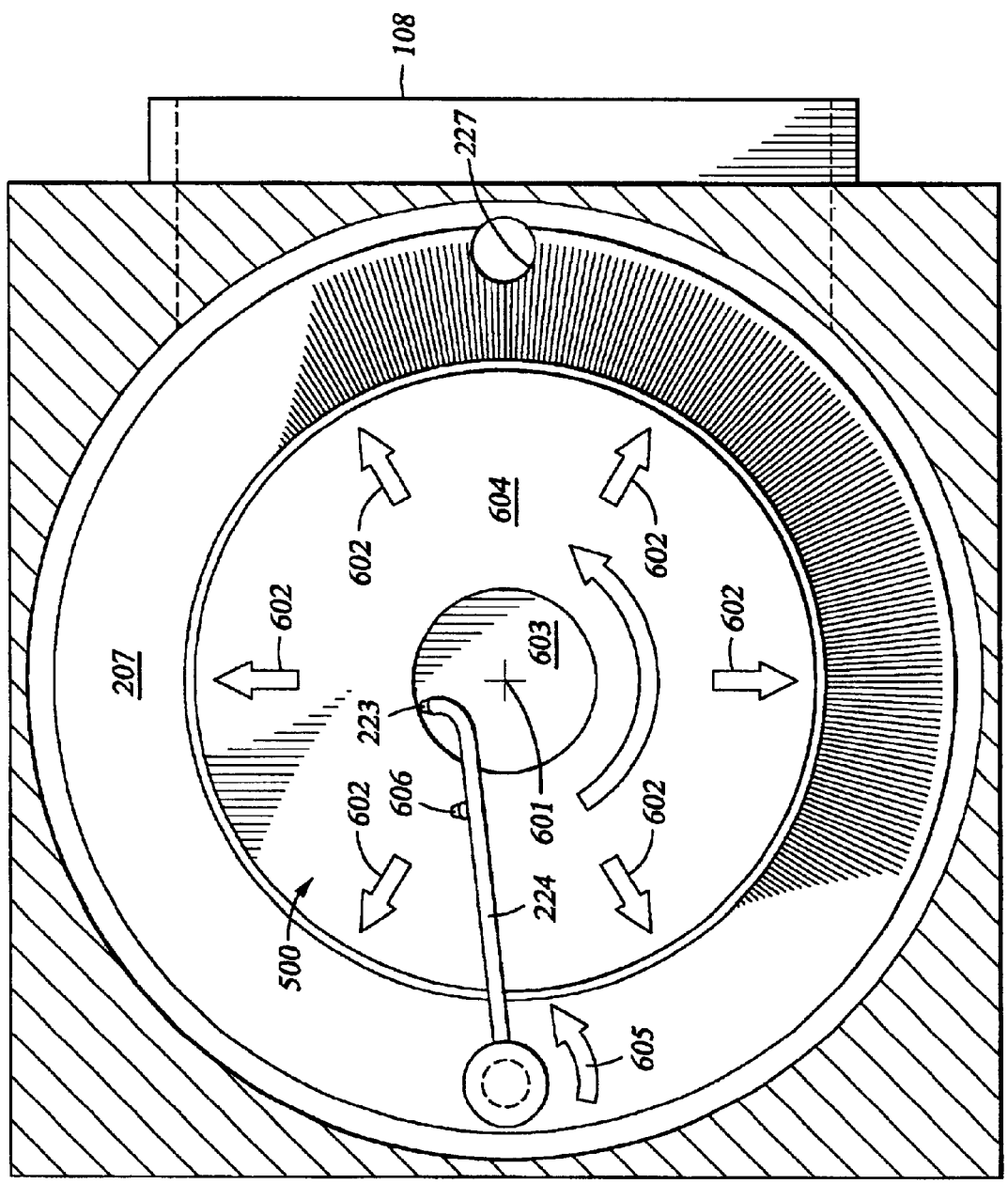
FIG. 6 illustrates a plan view of an exemplary embodiment of the invention.

Once backside conductive layer 503 is deposited, the deplating process for metal layer 501 of substrate 500 may be initiated. As noted above, the deplating process begins with substrate 500 being chucked to substrate support 212, as illustrated in FIG. 5c. The chucking process causes backside conductive layer 503 to be in electrical communication with the plurality of electrical contacts 302. As a result of chucking and contacting the substrate on the backside, the production surface of the substrate and the exclusion zone surrounding the production surface are not mechanically or electrically contacted, as with conventional devices. This configuration is generally termed a "non-contact" apparatus, as the production surface of the wafer is not contacted by the apparatus during the deplating process. Further, the cathode nozzle 223 also does not physically contact the substrate, as conventional cathodes do, thus further supporting the non-contact configuration. The chucking process also causes seal 304 to engage the back surface of substrate 500. This operates to generate a dry contact configuration, i.e., the contacts are sealed from the solution that is flowed over the substrate surface by seal 304. Once the substrate 500 is securely chucked and in electrical communication with contacts 302 motor 222 is energized by controller 230 and substrate support 212 begins to rotate at a predetermined rate. Nozzle 223 is then positioned immediately above the center of substrate 500 via actuation of stepping motor 231 by controller 230. Power supply 210 is activated by controller 230 in order to apply an electrical bias between the metal layer 501 via the anode contact ring 300 and the cathode fluid delivery nozzle 223. Once nozzle 223 is positioned above the center of substrate 500, substrate support 212 is rotating, and power supply 210 is activated, nozzle 223 begins to flow an electrically conductive electrolytic metal deplating solution onto center portion 601 of substrate 500, as illustrated in FIG. 6. The electrolytic deplating solution operates to both facilitate the deplating of metal layer 501, as well as to complete an electrical plating circuit.

The plating circuit may generally include the electrical path between the respective terminals of the power supply 210. In the embodiment of the invention illustrated in FIG. 2, the plating circuit would be the electrical circuit formed by the power supply 210, the cathode fluid dispensing nozzle 223, the anode contact ring 300, and the conductive deplating solution flowing between nozzle 223 and the substrate 211 positioned on ring 300. Thus, an electrical bias applied by power supply 210 may be conducted through and nozzle assembly 223 and applied to the substrate surface by the conductive deplating solution. The metal layer on the substrate surface conducts the electrical bias to the contact ring 300, which is in electrical communication with the power supply, thus completing the circuit. Chamber 200 is configured to deplate metal, and therefore, nozzle 223 is configured as the cathode, while the contact ring 300 is configured as the anode. The precise location of the cathode source may be varied between applications. For example, the deplating solution may be contained in a conductive cathode container that is in fluid communication with base member 225 and electrical communication with power supply 210. In this configuration, the cathode source/conductive cathode container may be located remotely from chamber 200. Alternatively arm 224 and/or nozzle 223 may be manufactured from a conductive material and be in electrical communication with power supply 210, and therefore, operate as the cathode.

The rate of rotation of substrate support 212 may be in the range of about 5 RPM up to about 10,000 RPM, depending upon the specific centrifugal force desired for the particular removal application. During the deplating processes, the rotation rate of substrate support member 212 may be between about 20 RPM and about 100 RPM. The rotation rate may be substantially increased to between about 500 RPM and about 2000 RPM during a drying process. Power supply 210 generally applies a constant DC voltage to the substrate during deplating processes. However, the applied voltage may be varied through application of a DC waveform generated by power supply 210, as mentioned above. The DC waveform applied to the substrate may be positive, negative, or a combination of positive and negative voltages, depending upon the waveform applied. In the exemplary embodiments of the invention, for example, a voltage between about 20 and about 40 volts may be applied to the substrate using a current of between about 30 amps and about 50 amps, for example. However, it is understood that types of features and chemistries used to deplate metal have a substantial effect upon the voltage and current that is required to deplate metal. The chemical solution, i.e., the metal removing solution dispensed from nozzle 223, may be, for example, a sulfuric acid solution ($H_2SO_4$), a hydrogen peroxide solution ($H_2O_2$), a copper sulfate solution ($CuSO_4$), or other chemical solution known to react with copper. The deplating solution may include a diluting element, which may be a fluoride solution or another glycol-type additive, for example. Regardless of the acidic solution used, the ph of the solution may be, for example, about 1. The solution generally flows radially outward across the substrate surface in the direction indicated by arrows 602.

When the chemical deplating solution contacts the substrate surface, an electrochemical reaction takes place that operates to remove the copper layer from the substrate surface proximate the point of contact with the chemical solution, i.e., at the location below nozzle 223. Therefore, during the initial stages of the removal process, i.e., when nozzle 223 is positioned above the center 601 of substrate 500, the metal layer 501 above center 601 is removed from substrate 500. However, when the metal layer 501 above center 601 is removed, the electrical circuit through power supply 210, nozzle 223, and metal layer 501 via contacts 302 experiences a substantial change in resistance. This substantial change in resistance, which is generally a resistance increase, is a result of a portion of the current path for the circuit being removed, i.e., the metal layer 501 operates as a conductor for the circuit, as metal layer 501 generally connects nozzle 223 to backside contacts 302. Therefore, when the metal layer 501 below nozzle 223 (above center 601) is removed, the current path from nozzle 223 to contacts 302 is broken or diminished, which results in a noticeable increase in the circuit voltage.

Since power supply 210 is generally configured to output a constant current during the deplating/metal layer removal process, the increase in circuit voltage resulting from metal layer 501 being removed from the area below nozzle 223 may be measured and/or monitored by controller 230.

Figure 7:
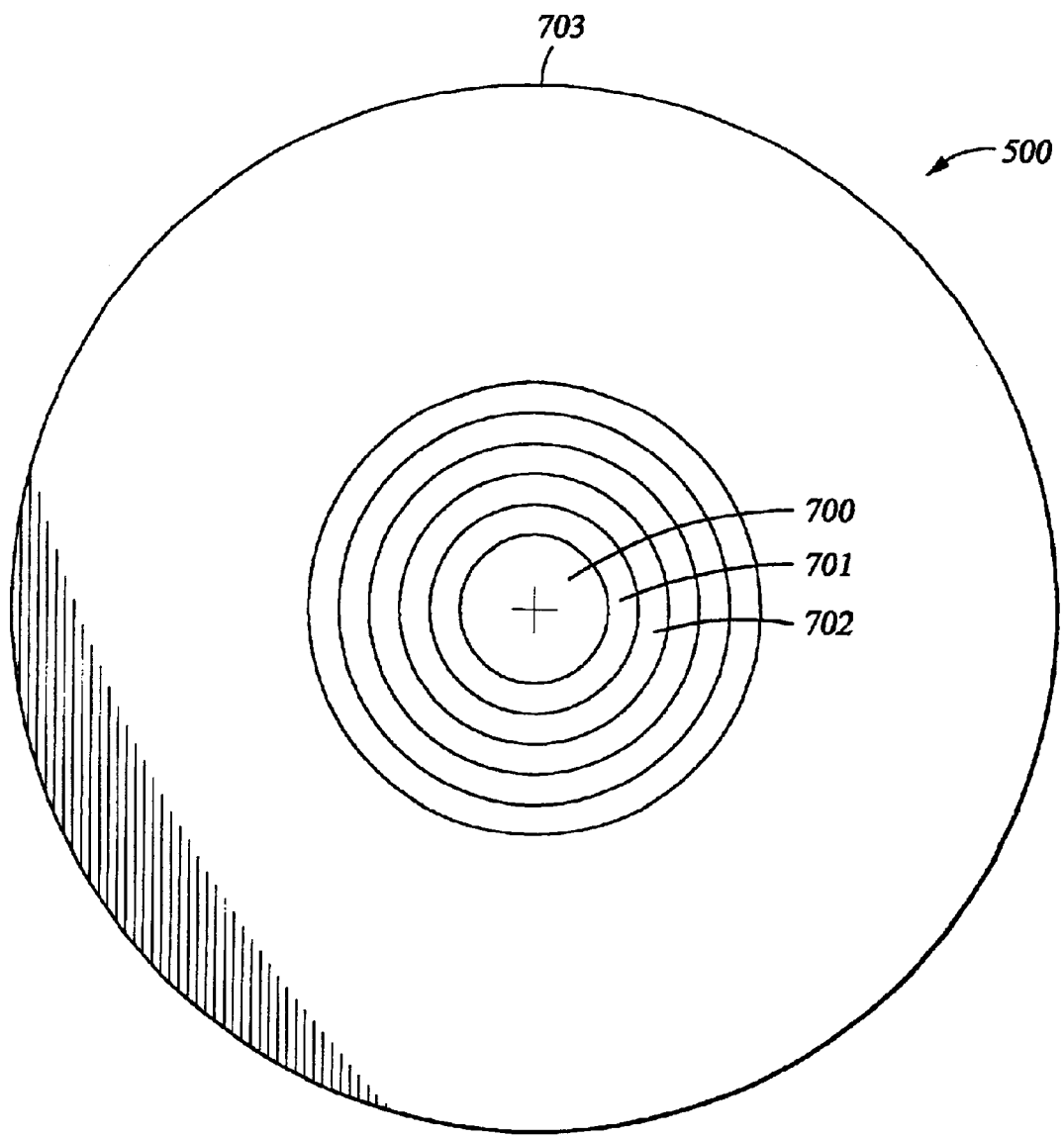
FIG. 7 illustrates an exemplary plan view of a substrate during a plating process of the invention

Therefore, when the circuit voltage increases above a predetermined threshold, where the threshold is calculated to represent the point where metal layer 501 is removed from the area below nozzle 223, controller 230 may be configured to adjust the radial position of arm 224 so that nozzle 223 is over an area of metal layer 501 that has not been removed yet. For example, FIG. 7 illustrates substrate 500 during the metal removal process. Initially, nozzle 223 will be positioned above substrate center 601, and therefore, the metal layer 501 in region 700 proximate center 601 will be removed. Once metal layer 501 in central region 700 is removed, the voltage in the circuit will increase. Controller 230 monitors the increased voltage and actuates stepping motor 231 in response thereto, which adjusts the radial position of arm 224 so that nozzle 223 is over annular region 701 where metal layer 501 has not yet been removed. The metal removal process continues until the voltage in the circuit again increases past the predetermined threshold indicating that the metal layer 501 in annular region 701 has been removed. When the voltage increases past the threshold, controller 231 again adjusts the radial position of arm 224 to position nozzle 223 over annular region 702 where the metal layer 501 has not yet been removed. This process continues successively through numerous annular regions of substrate 500 until nozzle 223 reaches the perimeter 703 of substrate 500. Therefore, generally, as the metal layer removal process continues, the radial position of arm 122 may be adjusted outward from center 601 by controller 230 in order to facilitate removal of the remaining metal layer 501 from the outer portion 604 of substrate 500, as illustrated in FIG. 6. The direction of radial or pivotal movement of arm 224 is shown by arrow 605, and generally includes a radial or pivotal movement of arm 224 that causes nozzle 223 to be moved away from the center 601 of substrate 500.

During the metal removal process, the electrolytic chemical solution that flows from nozzle 223 across the substrate surface is urged toward the perimeter of substrate 500 by the centrifugal force generated by the rotation thereof. The flow rate across the surface of the substrate 500 may be adjusted by increasing or decreasing the rate of rotation of substrate support 212, where a faster rotation will cause the flow of the electrolytic solution across the substrate surface to be accelerated. This flow rate is important to proper metal layer removal, as a slow flow rate of the solution across the surface of the substrate 500 may allow the solution to permeate the over deposited metal layer and begin to remove the metal deposited in the features 502 of the substrate. Therefore, the rate of rotation is generally calculated to be sufficient to cause the chemical solution to flow away from the center of the substrate 500 at a sufficient rate to keep the chemical solution from removing metal from the features of the substrate 500 beneath the over deposited metal layer. As such, the chemical solution generally travels across the substrate surface toward the perimeter and runs off the edge and falls onto bottom portion 207 of chamber 200. Bottom portion 207 may be tapered or slanted in order to direct the fluid falling from substrate support 212 toward a fluid recovery drain 227.

Additionally, in order to further regulate and monitor the removal rate of the metal layer across the surface of the substrate, a dilution nozzle 606 positioned on arm 224 may be used to flow a neutralizing fluid onto the substrate surface at a position outside of nozzle 223. The neutralizing fluid dispensed from nozzle 606, which may be deionized water, for example, may operate to dilute the chemical solution dispensed from nozzle 223 to a point where the chemical solution no longer removes metal from the substrate surface on the surface area of the substrate outside of nozzle 223. Further, the dilution nozzle 606 may increase the resistivity of the fluid flowing across the substrate surface, which operates to contain the bulk of the electrical flow to metal layer 501. Therefore, the dilution nozzle 606 operates to both contain the metal removal process to the area proximate nozzle 223 and to encourage the current flowing from nozzle 223 to contacts 302 to flow through metal layer 501 and not the fluid passing over the surface of substrate 500.

Figure 5D:
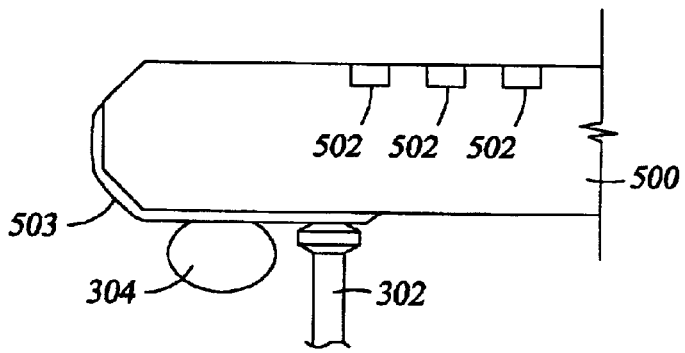
Figure 5E:
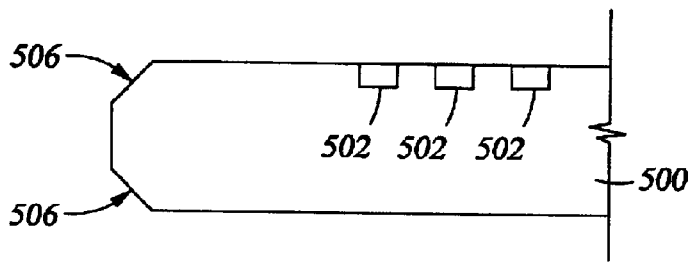

Once the metal layer 501 has been removed from the substrate surface, i.e. once the radial position of arm 224 has been pivoted through a range that allows nozzle 223 to reach the edge or perimeter of substrate 500, as shown in FIG. 5d, then the metal removal process for the production surface is complete. At this stage, although metal layer 501 is removed, the metal remains within features 502. However, backside conductive layer 503 must generally be removed from the bevel 506 and backside of substrate 500. An edge bead removal process, a deplating process, or other metal removal process may be used to remove backside conductive layer 503 from substrate 500. Once backside conductive layer 503 is removed, as shown in FIG. 5e, the metal layer removal process for substrate 500 is generally complete.

While the foregoing is directed to embodiments of the present invention, other and further embodiments of the invention may be devised without departing from the basic scope thereof, and the scope thereof is determined by the claims that follow.

What is claimed is:

1. A method for removing a metal layer from a substrate, comprising:
    rotating a substrate in a face up position on a rotatable substrate support member;
    positioning a cathode fluid dispensing nozzle over the substrate;
    dispensing a metal removing solution from the cathode fluid dispensing nozzle onto the substrate;
    applying an electrical bias between the substrate and the cathode fluid dispensing nozzle; and
    pivoting the cathode fluid dispensing nozzle in order to dispense the metal removing solution across a surface of the substrate while the substrate is rotating.

2. The method of claim 1, further comprising adjusting a radial position of the cathode fluid dispensing nozzle in response to a parameter of the electrical bias exceeding a predetermined threshold.

3. The method of claim 1, wherein applying the electrical bias further comprises electrically connecting a negative output of a power supply to the cathode fluid dispensing nozzle and electrically connecting a positive output of the power supply to the substrate.

4. The method of claim 3, wherein connecting the positive output of the power supply to the substrate comprises electrically contacting a backside conductive layer on the substrate with an anode contact ring positioned on the substrate support member.

5. The method of claim 4, wherein electrically contacting the backside conductive layer further comprises electrically engaging the backside conductive layer with a plurality of radially positioned conductive electrical contacts formed into the anode contact ring.

6. The method of claim 5, wherein each of the plurality of radially positioned conductive electrical contacts are in electrical communication with the positive output of the power supply.

7. The method of claim 2, wherein adjusting the radial position of the cathode fluid dispensing nozzle outward comprises:

removing the metal layer from a first annular area on the surface of the substrate, wherein the first annular area corresponds to the area covered by the cathode fluid dispensing nozzle during a rotation of the substrate; and adjusting the radial position of the nozzle outward to a second annular area on the surface of the substrate, wherein the second annular area immediately circumscribes the first annular area and has the metal layer remaining thereon.

8. The method of claim 1, further comprising depositing a backside conductive layer on a bevel portion of the substrate extending onto a portion of a backside of the substrate.

9. The method of claim 1, further comprising vacuum chucking the substrate to the rotatable substrate support member and electrically contacting the substrate.

10. The method of claim 1, wherein applying an electrical bias comprises electrically engaging the substrate with a contact ring.

11. The method of claim 10, wherein the contact ring electrically engages a production surface of the substrate proximate a perimeter thereof.

12. The method of claim 1, further comprising dispensing a neutralizing fluid onto the substrate surface to dilute the metal removing solution.

13. The method of claim 12, wherein the neutralizing fluid is dispensed by a dilution nozzle.

14. The method of claim 12, wherein the neutralizing fluid and the metal removing solution are dispensed on separate positions of the substrate surface.

15. The method of claim 1, wherein the cathode fluid dispensing nozzle is pivoted when at least one of a plating circuit voltage and a plating circuit resistance exceeds a predetermined threshold.

16. A method for removing a metal layer from a substrate, comprising:

rotating a substrate in a face up position on a rotatable substrate support member;

positioning a cathode fluid dispensing nozzle over a central portion of the substrate;

dispensing a metal removing solution from the cathode fluid dispensing nozzle onto the central portion of the substrate;

applying an electrical bias between the substrate end the cathode fluid dispensing nozzle;

pivoting the cathode fluid dispensing nozzle in order to dispense the metal removing solution across a surface of the substrate while the substrate is rotating; and removing a conductive layer from the backside of the substrate.

17. The method of claim 16, wherein the cathode fluid dispensing nozzle is pivoted when at least one of a plating circuit voltage and a plating circuit resistance exceeds a predetermined threshold.

* * * * *

UNITED STATES PATENT AND TRADEMARK OFFICE
CERTIFICATE OF CORRECTION

PATENT NO. : 6,720,263 B2
APPLICATION NO. : 09/981505
DATED : May 13, 2003
INVENTOR(S) : Tsai et al.

Page 1 of 1

It is certified that error appears in the above-identified patent and that said Letters Patent is hereby corrected as shown below:

<u>Column 5</u>
Line 51, please delete "in the".

<u>Column 7</u>
Line 42, please change "deposed" to -- disposed --.

<u>Column 9</u>
Line 17, please change "a out 50" to -- about 50 --.

Signed and Sealed this

Sixteenth Day of September, 2008

JON W. DUDAS
*Director of the United States Patent and Trademark Office*

UNITED STATES PATENT AND TRADEMARK OFFICE
CERTIFICATE OF CORRECTION

PATENT NO.         : 6,720,263 B2  
APPLICATION NO. : 09/981505  
DATED                  : April 13, 2004  
INVENTOR(S)       : Donald J. K. Olgado et al.

Page 1 of 1

It is certified that error appears in the above-identified patent and that said Letters Patent is hereby corrected as shown below:

This certificate supersedes the Certificate of Correction issued September 15, 2008. The certificate should be vacated since no Certificate of Correction was granted for this patent number.

Signed and Sealed this

Seventh Day of October, 2008

JON W. DUDAS  
*Director of the United States Patent and Trademark Office*